(12) United States Patent
Arbuthnot et al.

(10) Patent No.: US 10,490,488 B2
(45) Date of Patent: Nov. 26, 2019

(54) SEMICONDUCTOR DEVICES AND METHODS OF MAKING THE SAME

(71) Applicant: Semiconductor Components Industries, LLC, Phoenix, AZ (US)

(72) Inventors: Roger M. Arbuthnot, Mesa, AZ (US); Stephen St. Germain, Scottsdale, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 91 days.

(21) Appl. No.: 15/871,414

(22) Filed: Jan. 15, 2018

(65) Prior Publication Data

US 2018/0138109 A1 May 17, 2018

Related U.S. Application Data

(63) Continuation of application No. 15/421,515, filed on Feb. 1, 2017, which is a continuation of application
(Continued)

(51) Int. Cl.
*H01L 21/48* (2006.01)
*H01L 23/495* (2006.01)
(Continued)

(52) U.S. Cl.
CPC .... *H01L 23/49513* (2013.01); *H01L 21/4825* (2013.01); *H01L 21/565* (2013.01); *H01L 23/3114* (2013.01); *H01L 23/492* (2013.01); *H01L 23/49503* (2013.01); *H01L 23/49541* (2013.01); *H01L 23/49548* (2013.01); *H01L 23/49562* (2013.01); *H01L 24/05* (2013.01); *H01L 24/06* (2013.01); *H01L 24/32* (2013.01); *H01L 24/37* (2013.01); *H01L 24/40* (2013.01); *H01L 24/67* (2013.01); *H01L 24/83* (2013.01); *H01L 24/89* (2013.01); *H01L 24/29* (2013.01); *H01L 24/33* (2013.01); *H01L 24/41* (2013.01); *H01L 24/48* (2013.01); *H01L 24/73* (2013.01); *H01L 2224/04026* (2013.01); *H01L 2224/04034* (2013.01); *H01L 2224/04042* (2013.01);
(Continued)

(58) Field of Classification Search
CPC ......... H01L 23/49541; H01L 23/49562; H01L 23/3114; H01L 23/492; H01L 23/49548; H01L 23/49503; H01L 23/4954; H01L 23/49513; H01L 24/05; H01L 24/06; H01L 24/83; H01L 24/37; H01L 24/67; H01L 24/89; H01L 24/33; H01L 24/40; H01L 24/41; H01L 24/48; H01L 24/32; H01L 24/29; H01L 24/73; H01L 2224/4103; H01L 2224/37012; H01L 2224/04034; H01L 2224/84385; H01L 2224/37011; H01L 2224/40499; H01L 2224/83815; H01L 2224/05552; H01L 2224/83192; H01L 2224/83385; H01L 2224/05553; H01L 2224/73265; H01L 2224/04042
See application file for complete search history.

(56) References Cited

U.S. PATENT DOCUMENTS

6,100,580 A 8/2000 Murakami et al.
6,613,829 B2 9/2003 Fukuizumi et al.
(Continued)

*Primary Examiner* — Hoa B Trinh
(74) *Attorney, Agent, or Firm* — Adam R. Stephenson, Ltd.

(57) ABSTRACT

In one embodiment, methods for making semiconductor devices are disclosed.

20 Claims, 10 Drawing Sheets

Related U.S. Application Data

No. 15/204,117, filed on Jul. 7, 2016, now Pat. No. 9,576,883, which is a continuation of application No. 14/729,234, filed on Jun. 3, 2015, now Pat. No. 9,397,028, which is a continuation of application No. 13/834,612, filed on Mar. 15, 2013, now Pat. No. 9,070,721.

(51) Int. Cl.
  *H01L 23/00* (2006.01)
  *H01L 23/492* (2006.01)
  *H01L 21/56* (2006.01)
  *H01L 23/31* (2006.01)

(52) U.S. Cl.
  CPC .............. *H01L 2224/05552* (2013.01); *H01L 2224/05553* (2013.01); *H01L 2224/05554* (2013.01); *H01L 2224/06051* (2013.01); *H01L 2224/06181* (2013.01); *H01L 2224/26175* (2013.01); *H01L 2224/291* (2013.01); *H01L 2224/32245* (2013.01); *H01L 2224/32258* (2013.01); *H01L 2224/33181* (2013.01); *H01L 2224/37011* (2013.01); *H01L 2224/37012* (2013.01); *H01L 2224/40245* (2013.01); *H01L 2224/40499* (2013.01); *H01L 2224/4103* (2013.01); *H01L 2224/45015* (2013.01); *H01L 2224/48247* (2013.01); *H01L 2224/73263* (2013.01); *H01L 2224/73265* (2013.01); *H01L 2224/83192* (2013.01); *H01L 2224/83385* (2013.01); *H01L 2224/83801* (2013.01); *H01L 2224/83815* (2013.01); *H01L 2224/84385* (2013.01); *H01L 2224/84801* (2013.01); *H01L 2924/00014* (2013.01); *H01L 2924/1305* (2013.01); *H01L 2924/13091* (2013.01)

(56) References Cited

U.S. PATENT DOCUMENTS

| | | | |
|---|---|---|---|
| 6,624,522 | B2 | 9/2003 | Standing et al. |
| 6,744,119 | B2 | 6/2004 | Kuo et al. |
| 6,768,188 | B2 | 7/2004 | Moriguchi |
| 6,777,800 | B2 | 8/2004 | Madrid et al. |
| 6,828,659 | B2 | 12/2004 | Iwakiri |
| 7,238,551 | B2 | 7/2007 | Kasem et al. |
| 7,394,150 | B2 | 7/2008 | Kasem et al. |
| 7,633,141 | B2 | 12/2009 | Huber |
| 7,663,211 | B2 | 2/2010 | Noquil et al. |
| 8,129,845 | B2 | 3/2012 | Jang et al. |
| 8,193,043 | B2 | 6/2012 | Jeon et al. |
| 2003/0052408 | A1 | 3/2003 | Quniones et al. |
| 2006/0110856 | A1* | 5/2006 | Kasem ............ H01L 23/49524 438/123 |
| 2008/0054438 | A1 | 3/2008 | Germain et al. |
| 2009/0057855 | A1 | 3/2009 | Quinones et al. |
| 2009/0269885 | A1 | 10/2009 | Madrid et al. |
| 2010/0258924 | A1 | 10/2010 | Cruz et al. |
| 2011/0095411 | A1 | 4/2011 | Herbsommer et al. |
| 2012/0139107 | A1 | 6/2012 | Nakano |

* cited by examiner

SEMICONDUCTOR DEVICES AND METHODS OF MAKING THE SAME

CROSS-REFERENCE TO RELATED APPLICATION

This application is a continuation of U.S. application Ser. No. 15/421,515, filed Feb. 1, 2017, which is a continuation of U.S. application Ser. No. 15/204,117, filed Jul. 7, 2016, now U.S. Pat. No. 9,576,883, which is a continuation of U.S. application Ser. No. 14/729,234, filed Jun. 3, 2015, now U.S. Pat. No. 9,397,028, which is a continuation of U.S. application Ser. No. 13/834,612, filed Mar. 15, 2013, now U.S. Pat. No. 9,070,721, which are hereby incorporated by reference in their entirety.

BACKGROUND

The present application relates, in general, to electronics, and more particularly, to methods of forming packaging structure for semiconductor devices.

The semiconductor industry typically utilizes various methods and structures to form packages that encapsulate a semiconductor die and provide leads for electrically connecting to the semiconductor die. In one type of semiconductor package, the semiconductor die is mounted between a lead frame and a clip. The lower lead frame has a continuous flat surface on which the die is mounted then a clip is used to complete the electrical circuit on the top of the die. This configuration may provide inaccurate positioning of the semiconductor die to the lower lead frame. In addition, the same inaccurate positioning can occur with the clip. During mounting of both the die and clip, solder paste is typically used between the die to lead frame and clip to die. During reflow, both the die and clip may move, drift, tilt, and/or rotate, which can lower the quality and performance of the semiconductor device.

Accordingly, it is desirable to have techniques for mounting a semiconductor die that can reduce or eliminate drifting, tilting, or rotation. It is also desirable to have techniques for mounting different semiconductor dies using the same lead frame design.

BRIEF DESCRIPTION OF THE DRAWINGS

Embodiments of present application will become more fully understood from the detailed description and the accompanying drawings, which are not intended to limit the scope of the present application.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type of P-type doped regions, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. The use of the word approximately or substantially means that a value of element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

DETAILED DESCRIPTION

The following description of embodiment(s) is merely illustrative in nature and is in no way intended to limit the invention, its application, or uses. The present application includes, among other things, a method of making a semiconductor device including: providing a conductive substrate, the conductive substrate comprising one or more elevated regions on a first side of the conductive substrate, wherein each of the elevated regions comprises a planar surface on the first side of the conductive substrate; disposing a solder paste between at least one of the planar surfaces on the elevated regions on the conductive substrate and one or more contact pads of a semiconductor die such that each of the contacts pads has three or more linear edges that are each laterally aligned and parallel with at least one edge of the planar surfaces on the elevated regions; and reflowing the solder paste to solder at least a portion of the elevated regions to the contact pads.

Figure 1A:
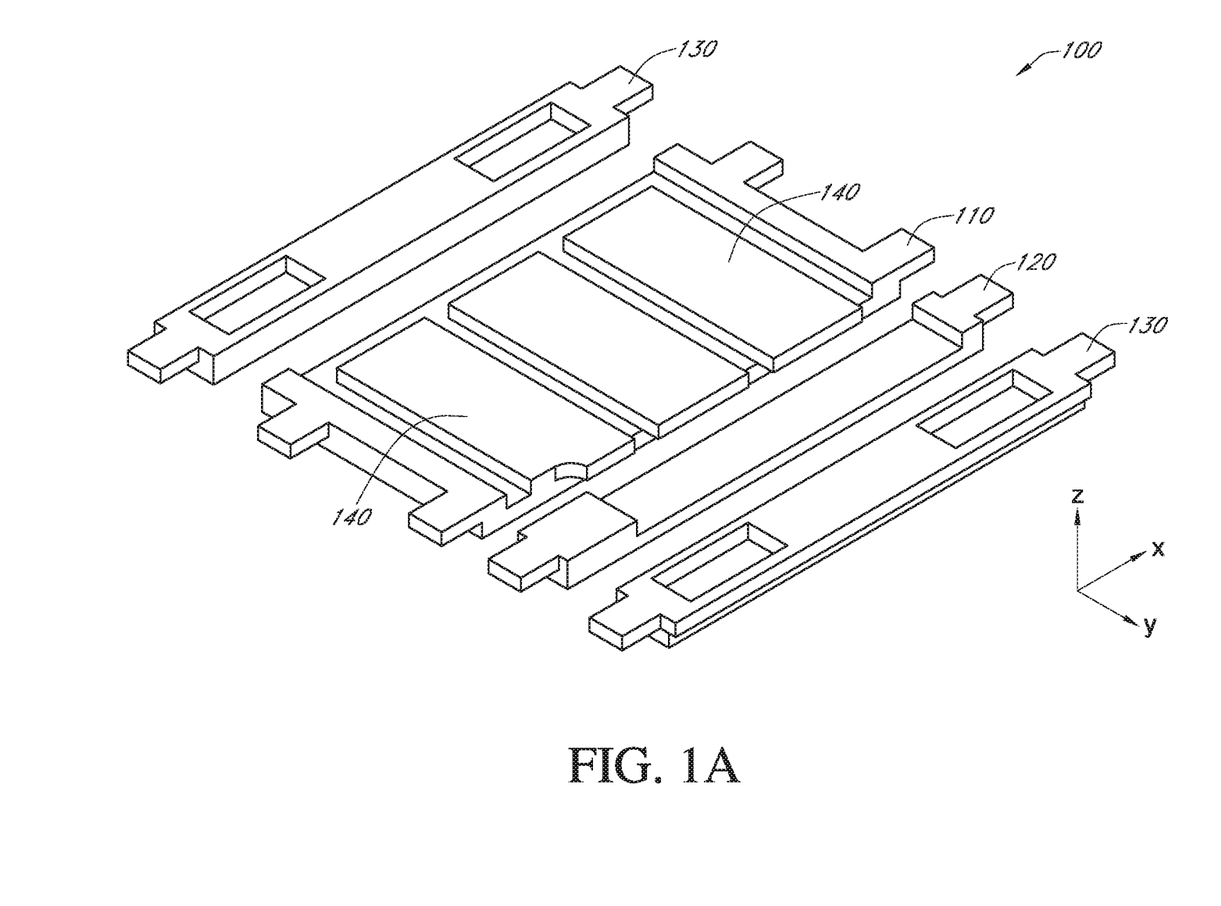
FIG. 1A is a perspective view illustrating one example of a lead frame in accordance with some embodiments of the present application.
Figure 1B:
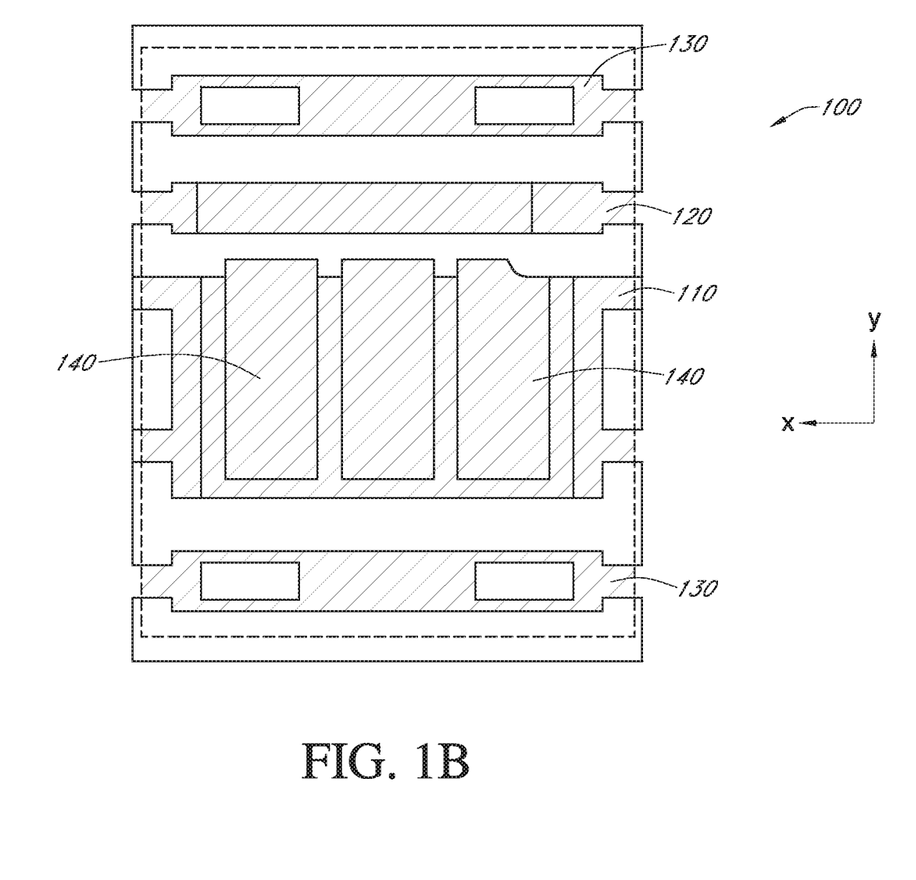
FIG. 1B is a top view one example of a lead frame in accordance with some embodiments of the present application.
Figure 1C:
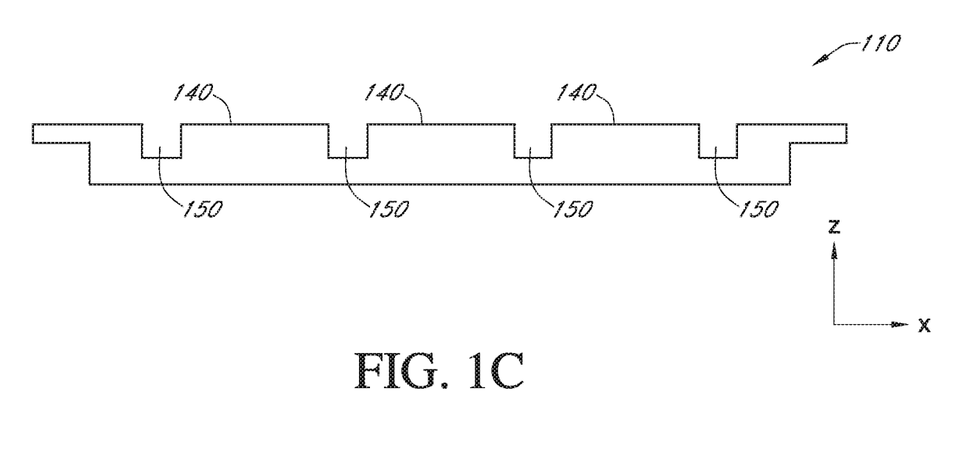
FIG. 1C is a cross-sectional view of source contact pad of a lead frame in accordance with some embodiments of the present application.

FIG. 1A is a perspective view illustrating one example of lead frame 100 in accordance with some embodiments of the present application. Lead frame 100 includes source contact 110, gate contact 120, and drain contact 130. Source contact 110 includes pedestals 140 (also referred to as standoffs or elevated regions) disposed on one side of source contact 110. Lead frame 100 may be formed, for example, by etching or stamping a copper or copper-alloy sheet. FIG. 1B is a top view of lead frame 100. It will be appreciated that during typical packaging processes, the lead frame and its various contacts (e.g., source contact 110) may be interconnected in an array of lead frames that can be singulated into individual packages during processing. The dashed line in FIG. 1B depicts cuttings lines where lead frame 100 can be separated using standard techniques, such as dicing or punching. FIG. 1C is a cross-sectional view of source contact pad 110 in lead frame 100. Pedestals 140 can be isolated by trenches 150 between pedestals 140. Pedestals 140 each have planar surfaces on the same side of lead frame 100. As discussed further below, the pedestals can be configured to align with contact pads on a semiconductor die.

The height of the pedestals (e.g., pedestals 140) can be, in some embodiments, at least about 30% of a thickness of the contact. For example, the source contact may be formed from a copper sheet having a thickness of about 10 mils, and therefore the height of the pedestals can be at least about 3 mils. In some embodiments, the pedestals can have a height of at least about 50% of a thickness of the contact. In some embodiments, the pedestals can, in some embodiments, have a height of at least about 3 mils or at least about 5 mils. The distance between the pedestals (e.g., the width of trenches 150) can be, in some embodiments, at least about the height of the pedestals. In some embodiments, the distance between the pedestals can be at least about 30% of a thickness of the contact or at least about 50% of a thickness of the contact. The distance between the pedestals can be, for example, at least about 3 mils or at least about 5 mils.

The shape of the pedestals is not particularly limited. The top surface of the pedestals may, for example, have a polygonal surface, such as a square, a rectangle, or a triangle. In some embodiments, the top surface of each of the pedestals can include at least one linear edge (e.g., one, two, three, four or more linear edges). For example, as shown in FIG. 1B pedestals 140 can be rectangular having four linear edges. The pedestals may also include at least one curved edge, for example, to accommodate an adjacent gate contact.

Figure 2A:
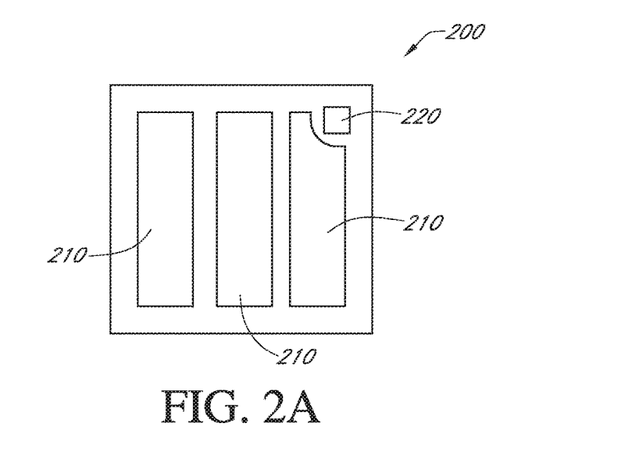
FIGS. 2A and 2B are bottom and top views, respectively, illustrating one example of semiconductor die 200 in accordance with some embodiments of the present application.
Figure 2B:
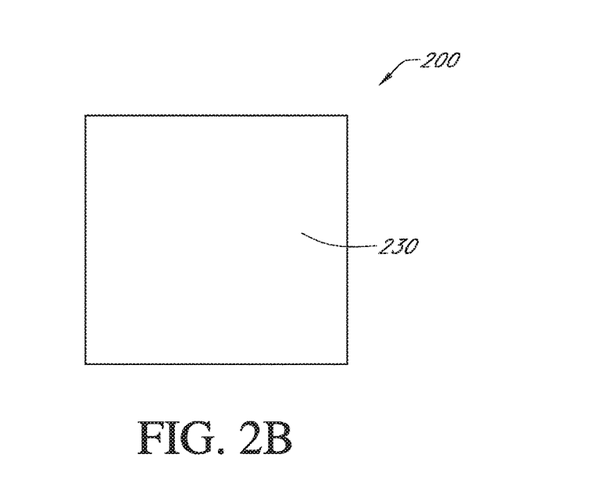

FIGS. 2A and 2B are bottom and top views, respectively, illustrating one example of semiconductor die 200 in accordance with some embodiments of the present application. Semiconductor die 200 includes source contact pads 210 and gate contact pad 220 on one side. Semiconductor die 200 also includes drain contact pad 230 on a side of semiconductor die 200 opposite source contact pads 210. Semiconductor die 200 may be configured, for example, as a MOSFET. Source contact pads 210 can be configured so that each of the contact pads can be soldered to a pedestal on a source contact of a lead frame (e.g., pedestals 140 on source contact 110 of lead frame 100). For example, each of source contact pads 210 may have the same shape and dimensions as a corresponding pedestal in pedestals 140 on source contact 110. Semiconductor die 200 may have the bottom surface placed over lead frame 100 such that each of source contact pads 210 align with one of pedestals 140. Similarly, gate contact pad 210 on semiconductor die 200 may align with gate contact 120 of lead frame 100.

Figure 3A:
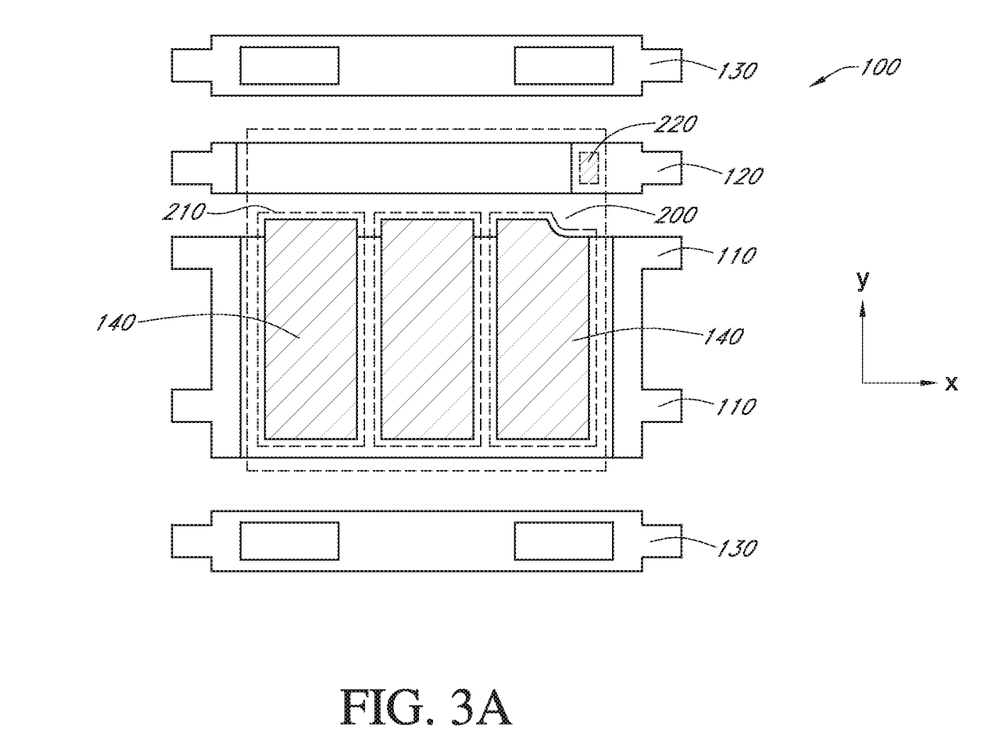
FIG. 3A is a top view illustrating one example of semiconductor die 200 positioned on lead frame 100 in accordance with some embodiments of the present application.

FIG. 3A shows a top view illustrating one example of semiconductor die 200 positioned on lead frame 100 in accordance with some embodiments of the present application. Semiconductor die 200 is shown with dashed lines and is positioned over lead frame 100 so that source contact pads 210 can be aligned over pedestals 140. Each of the pedestals from pedestals 140 include four linear edges that are laterally aligned and parallel with four linear edges of each contact pad in contact pads 210. (The right-most pedestal of pedestals 140 also includes a curved edge that is laterally aligned with a curved edge of the right-most source contact pad of source contact pads 210.) Gate contact pad 220 is also aligned over gate contact 120. The pedestals can be soldered to the source contact pads to electrically couple source contact 110 to source contact pads 220.

Figure 3B:
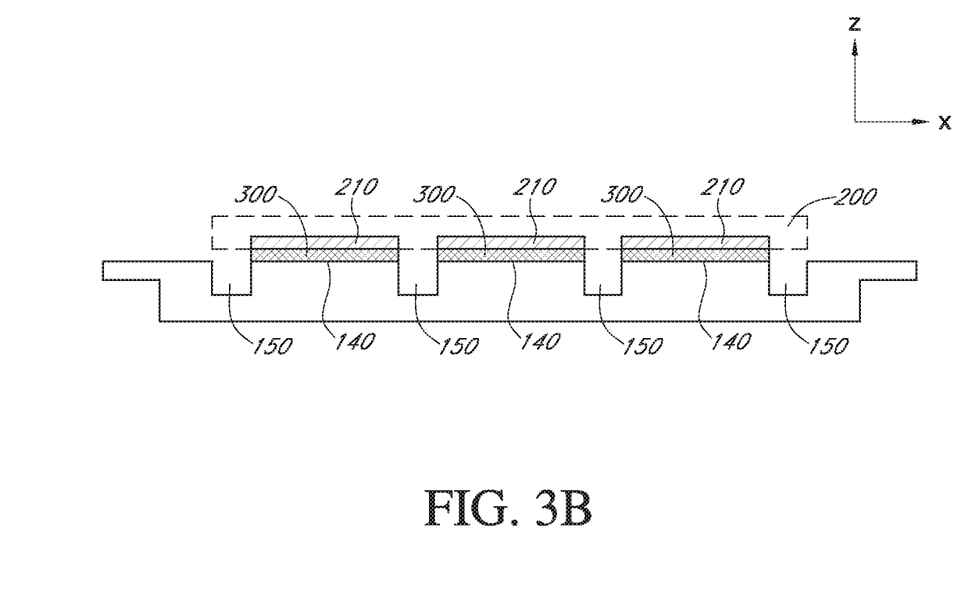
FIG. 3B is a cross-sectional view illustrating semiconductor die 200 positioned on lead frame 100 in accordance with some embodiments of the present application.

FIG. 3B show a cross-sectional view illustrating semiconductor die 200 positioned on lead frame 100 in accordance with some embodiments of the present application. Solder paste 300 can be disposed between each of contact source pads 220 and pedestals 140. The solder paste may be applied such that trenches 150 are substantially free of solder paste. For example, solder paste 300 can be selectively applied to pedestals 140 before positioning semiconductor die 200 on lead frame 100 so that solder paste 300 is sandwiched between source contact pads 210 and pedestals 140. Solder paste may similarly be disposed between gate contact pad 220 and gate contact 120.

The amount of solder paste applied between the pedestals and the contact pads is not particularly limited. Generally, the amount of solder paste applied is effective to electrically couple the contact pad to the conductive surface (e.g., the lead frame) and also effective such that the solder paste does not bridge between the pedestals during reflow. In some embodiments, the solder paste is evenly applied as a layer to the portions of the pedestal or contact pad to be soldered during reflow. In some embodiments, the solder paste is applied as a layer having a thickness about 0.003 inches to about 0.006 inches.

Pedestals 140 can be soldered to source contact pads 210 by heating the semiconductor die and lead frame to perform reflow. In some embodiments, during reflow, the solder paste is maintained between the pedestals and the contact pads. That is, the solder paste does not flow into the trenches surrounding the pedestals. Similarly, the separate layers of solder paste disposed between each pair of contact pad and pedestal can remain spaced apart during reflow. In other words, layers of solder paste do not flow into a trench adjacent to both of the layers such that the solder paste from separate layers contact each other.

Applicants have discovered that by soldering the pedestals to the contact pads, drifting, tilting, or rotation during reflow can be reduced or eliminated. Without being bound to any particular theory, it is believed that, by aligning edges of the pedestals with edges of the contact pads, the solder's surface tension and wet adhesion properties during reflow can maintain the pedestals aligned with the contact pads. This in turn limits or prevents the semiconductor die from rotating, tilting, or drifting during reflow.

Accordingly, in some embodiments, each contact pad that is soldered to a pedestal will have two or more linear edges that are each laterally aligned and parallel with a linear of edge of a pedestal that is soldered to the contact pad. In some embodiments, each contact pad that is soldered to a pedestal will have three or more linear edges that are each laterally aligned and parallel with a linear of edge of a pedestal that is soldered to the contact pad. In some embodiments, each contact pad that is soldered to a pedestal will have four or more linear edges that are each laterally aligned and parallel with a linear of edge of a pedestal that is soldered to the contact pad. In some embodiments, each contact pad that is soldered to a pedestal will have two or more corners that are each laterally aligned with a corner of a pedestal that is soldered to the contact pad. In some embodiments, each contact pad that is soldered to a pedestal will have three or more corners that are each laterally aligned with a corner of a pedestal that is soldered to the contact pad. In some embodiments, each contact pad that is soldered to a pedestal will have four or more corners that are each laterally aligned with a corner of a pedestal that is soldered to the contact pad.

As will be discussed further below, a single contact pad may optionally be soldered to two or more pedestals (e.g., two, three, four, five, six, or more pedestals). Thus, different linear edges of the same contact pad can be laterally aligned and parallel to edges of different pedestals. As an example, a rectangular contact pad can be soldered to two square pedestals. The rectangular contact pad may have two linear edges that are laterally aligned and parallel with two linear edges of the first square pedestal. The other two linear edges of the rectangular contact pad can be laterally aligned and parallel with two linear edges of the second square pedestal. Thus, in this specific example, all four linear edges of the rectangular contact pad are laterally aligned and parallel with linear edges found in two different pedestals. Moreover, each of the square pedestals includes two linear edges that are not laterally aligned with a linear edge of the rectangular contact pad. This example configuration may provide suitable adhesion to prevent drifting, tilting, or rotation during reflow. In some embodiments, at least two contact pads are each separately soldered to two or more pedestals. For example, a first contact pad (e.g., a source contact pad) of a semiconductor die can be soldered to a first pedestal of a contact (e.g., a source contact) on a lead frame and a second pedestal of the contact on the lead frame, and a second contact pad of the semiconductor die can be soldered to a third pedestal of the contact on the lead frame and a fourth pedestal of the contact on the lead frame.

Figure 3C:
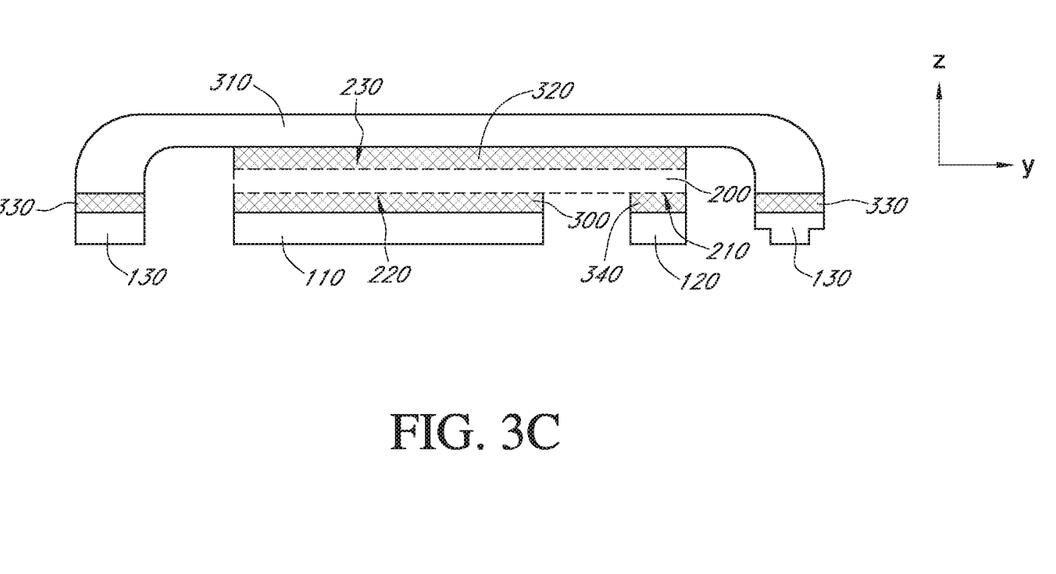
FIG. 3C is a cross-sectional view illustrating semiconductor die 200 positioned on lead frame 100 which is orthogonal to the cross-sectional view in FIG. 3B in accordance with some embodiments of the present application.

Drain contact pad 230 on semiconductor die 200 may be electrically coupled to drain contacts 130 on lead frame 100 using various techniques. For example, drain contact pad 230 can be wire bonded to drain contacts 130. In some embodiments, drain contact pad 230 can be electrically coupled to drain contacts 130 by a conductive clip. The conductive clip may be soldered to both drain contact pad 230 and drain contacts 130. FIG. 3C is a cross-sectional view illustrating semiconductor die 200 positioned between lead frame 100 and conductive clip 310. The cross-sectional view in FIG. 3C is orthogonal to the cross-sectional view in FIG. 3B. The bottom face of conductive clip 310 can be soldered to drain contact pad 230 using solder paste 320. Conductive clip 310 has a U-shaped configuration such that both ends can be soldered to drain contacts 130 in lead frame 100 using solder paste 330. By soldering conductive clip 310 to both drain contacts 130 and drain contact pad 230, drain contact 130 can be electrically coupled to drain contact pad 230. As shown in FIG. 3C, gate contact 120 can be soldered to gate contact pad 210 using solder paste 340. Gate contact 120 may be soldered to gate contact pad 210 at about the same time as performing reflow to solder source contact pad 220 to source contact 110.

The conductive clip can be soldered to the contact pad (e.g., a gate contact pad) and contact on the lead frame (e.g., a gate contact) using generally the same techniques as described above. For example, solder paste can be applied to the gate contact pad and gate contacts, and then the conductive clip can positioned to contact the solder paste before performing reflow. The reflow for soldering the conductive clip may be performed before, after, or at about the same time as performing reflow to solder the semiconductor die to the lead frame.

As discussed above, the pedestals on the lead frame can reduce or prevent drifting, tilting, or rotation during reflow. The pedestals may also be used to prevent or reduce drifting, tilting, or rotation when soldering any conductive substrate (e.g., a conductive clip or a lead frame) to a contact pad on a semiconductor die.

Figure 4:
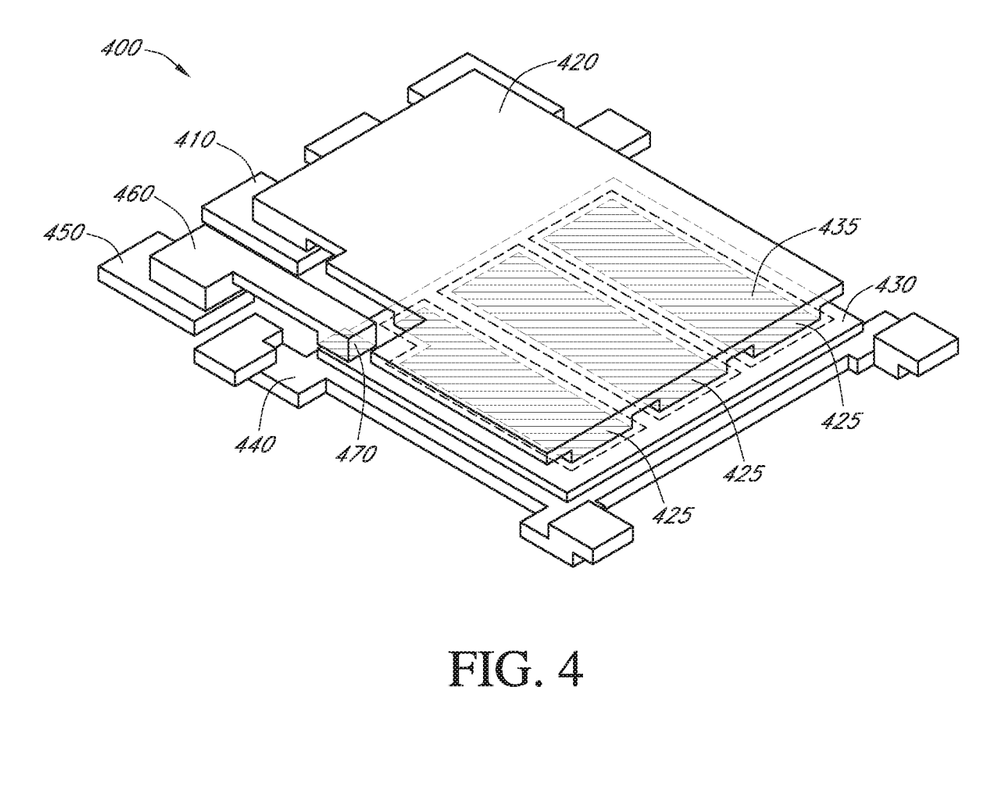
FIG. 4 is a perspective view illustrating one example of semiconductor device 400 in accordance with some embodiments of the present application.

FIG. 4 is a perspective view illustrating one example of semiconductor device 400 in accordance with some embodiments of the present application. Semiconductor device 400 can include source contact 410 soldered to conductive clip 420. Conductive clip 420 has pedestals 425 which extend from the side of conductive clip 420 that faces semiconductor die 430. Pedestals 425 can be soldered to source contact pads 435 on semiconductor die 430 such that source contact 410 is electrically coupled to source contact pads 435. As shown, four linear edges of the contact pads that are soldered to the pedestals are each laterally aligned and parallel with a linear of edge of a pedestal that is soldered to the contact pad. The pedestals on the conductive clip may therefore reduce or prevent drifting, tilting, or rotation during reflow. Drain contact 440 can be soldered to drain contact pads (not shown) on a side of semiconductor die 430 opposite source contact pads 435. Gate contact 450 is soldered to conductive clip 460. Gate contact pad 470 on semiconductor die 430 is also soldered to conductive clip 460 such that gate contact 470 is electrically coupled to gate contact pad 470.

The pedestals on a conductive substrate (e.g., pedestals 425 on conductive clip 420) can generally have the same characteristics as discussed above with regard to pedestals on a lead frame (e.g., pedestals 140 on lead frame 100). For example, the height of the pedestals may be about half of the thickness of the conductive clip. As another example, the number of pedestals on the conductive substrate is not limited, and may be, for example, one or more pedestals (e.g., one, two, three, four, five, ten, fifteen, twenty, or more pedestals on the conductive substrate). In some embodiments, at least one contact pad (e.g., one, two, three, four, or more contact pads) on the semiconductor die is soldered to two or more pedestals (e.g., two, three, four, five, or more pedestals) on the conductive substrate.

Semiconductor device 400 may generally be assembled using the same techniques as described above. Solder paste can be applied to the drain contact and then the drain contact is soldered to the drain contact pad on the semiconductor die by performing reflow. Solder paste may then be applied to the source contact pad, gate contact pad, source contact, and gate contact before positioning the conductive clips over the semiconductor die and lead frame. Reflow can be performed to solder the conductive clip. In some embodiments, the semiconductor die's contact pads are soldered to the lead frame and conductive clips at about the same time.

The semiconductor devices disclosed in the present application (e.g., semiconductor device 400) may be at least partially encapsulated in a molding material (e.g., a resin). In some embodiments, the molding material can fill the trenches between the pedestals. Portions of the lead frame and/or conductive clip may be exposed for electrically coupling the semiconductor die to, for example, a printed circuit board.

Some embodiments disclosed herein relate to a conductive substrate that is configured to operably couple with two or more different semiconductor die designs (e.g., two, three, four, five, or more semiconductor die designs). Typically, each lead frame or conductive clip is customized for soldering to a specific semiconductor die design. Thus, each semiconductor die design requires a different lead frame design that must be manufactured or stocked at manufacturing facilities. The present application includes a universal lead frame and/or universal conductive clip that may be used with various kinds of semiconductor die designs. This may reduce the number of different lead frames that must be manufactured or stocked at manufacturing facilities.

Figures 5A, 5B, 5C:
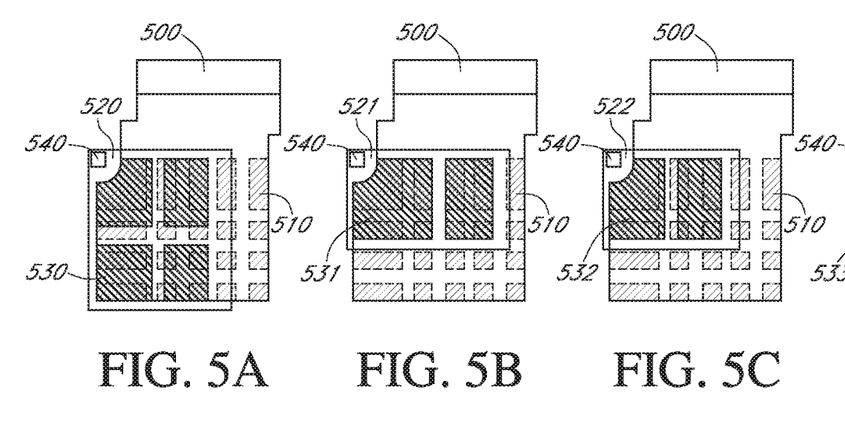
FIG. 5A is a bottom view showing one example of universal conductive clip 500 including a plurality of pedestals 510 that extend towards semiconductor die 520 in accordance with some embodiments of the present application.
FIG. 5B is a bottom view of one example of semiconductor die 521 soldered to universal conductive clip 500 in accordance with some embodiments of the present application.
FIG. 5C is a bottom view of one example of semiconductor die 522 soldered to universal conductive clip 500 in accordance with some embodiments of the present application.

FIGS. 5A-J are bottom views illustrating one example of universal conductive clip 500 soldered to various semiconductor dies in accordance with some embodiments of the present application. Referring to FIG. 5A, universal conductive clip 500 includes a plurality of pedestals 510 that extend towards semiconductor die 520. Semiconductor die 520 has contact pads 530 on one side that are each soldered to two or more pedestals of pedestals 510. The upper-left contact pad is soldered to two pedestals. The upper-left contact pad has two linear edges that are each laterally aligned and parallel with an edge on the upper-left pedestal that is soldered to the upper-left contact pad. The upper-left contact pad and upper-left pedestal each have curved edges that are laterally aligned. The curved edges are shaped to accommodate contact pad 540 which can be electrically coupled to a separate conductive clip (not shown). The upper-left contact pad is also soldered to a second pedestal below the upper-left pedestal. Only a portion of the top surface of the second pedestal is soldered to the upper-left contact pad. The left-most edge of the second pedestal is laterally aligned and parallel with the left-most edge of the upper-left contact pad. During manufacturing, solder paste can be selectively applied to the top surface of the second pedestal (and any other pedestal having only a portion of the top surface soldered to a contact pad) at portions that will contact a contact pad.

Each of contact pads 530 in FIG. 5A have two or more edges that are each laterally aligned and parallel with an edge of a pedestal. The number of pedestals soldered to each contact pad varies: the upper-left and lower-left contact pads are each soldered to two pedestals, the upper-right and lower-right contact pads are each soldered to four pedestals. Each of the contact pads has only a portion of their surface area soldered to the pedestals. The portions of the contact pads disposed over trenches between the pedestal can, in some embodiments, be unsoldered. The total surface area of each contact pad that is soldered to a pedestal can be, for example, at least about 40%, at least about 50%, at least about 75%, or at least about 90%. The total surface area of each contact pad that is soldered to a pedestal can be, for example, no more than about 100%, no more than about 95%, no more than about 90%, no more than about 80%, or no more than about 70%. In some embodiments, the total surface area of each contact pad that is soldered to a pedestal is about 40% to about 100%, or about 50% to about 95%.

Eight of the pedestals in pedestals 510 depicted in FIG. 5A are not soldered to a contact pad. As will be discussed further below, these unsoldered pedestals are designed for a different semiconductor die. Four of the pedestals are laterally positioned away from the footprint of semiconductor die 520. In other words, four of the pedestals are not covered by semiconductor die 520. Another four of the pedestals are only partially covered by semiconductor die 520.

FIG. 5B shows semiconductor die 521 soldered to universal conductive clip 500. Semiconductor die 521 has a different footprint and contact pad configuration relative to semiconductor die 520. However, contact pad 540 (e.g., a gate contact pad) has the same configuration in both semiconductor dies. Each of contact pads 531 are soldered to four pedestals of pedestals 510. As shown, each of contact pads 531 have four edges that are each laterally aligned and parallel with edges on the pedestals soldered to the contact pads. Each of the eight pedestals that are soldered have their entire top surface soldered to the contact pads. Twelve pedestals remain unsoldered to semiconductor die 531: ten are uncovered by the footprint of semiconductor die 531, while two are partially covered by the footprint of semiconductor die 531.

FIG. 5C shows semiconductor die 522 soldered to universal conductive clip 500. Semiconductor die 522 has a different footprint and contact pad configuration. However, contact pad 540 (e.g., a gate contact pad) has the same configuration relative to semiconductor die 520. The left contact pad of contact pads 532 is soldered to two pedestals of pedestals 510. The right contact pad of contact pads 532 is soldered to four pedestals of pedestals 510. The pedestals soldered to the left contact pad have their entire top surface soldered to the left contact pad. Two of the pedestals soldered to the right contact pad have only a portion of their top surface soldered to the right contact pad. Two of the pedestals soldered to the right contact pad have their entire top surface soldered to the right contact pad. Fourteen pedestals remain unsoldered to semiconductor die 522:

twelve are uncovered by the footprint of semiconductor die 522, while two are partially covered by the footprint of semiconductor die 522.

Figures 5D, 5E:
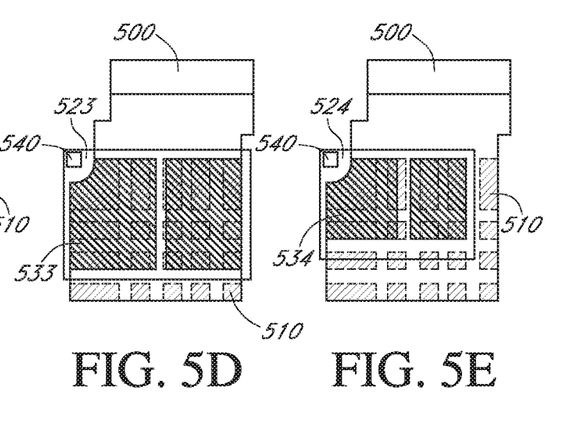
FIG. 5D is a bottom view of one example of semiconductor die 523 soldered to universal conductive clip 500 in accordance with some embodiments of the present application.
FIG. 5E is a bottom view of one example of semiconductor die 524 soldered to universal conductive clip 500 in accordance with some embodiments of the present application.

FIG. 5D shows semiconductor die 523 soldered to universal conductive clip 500. Semiconductor die 523 has a different footprint and contact pad configuration. However, contact pad 540 (e.g., a gate contact pad) has the same configuration relative to semiconductor die 520. The left-most contact pad of contact pads 533 is soldered to six pedestals of pedestals 510. The pedestals soldered to the left-most contact pad have their entire top surface soldered to the left-most contact pad. The right-most contact pad of contact pads 533 is soldered to four pedestals of pedestals 510. Two of the pedestals soldered to the right-most contact pad have their entire top surface soldered to the right-most contact pad. Two of the pedestals soldered to the right-most contact pad have only a portion of their top surface soldered to the right-most contact pad. Fourteen pedestals remain unsoldered to semiconductor die 523: twelve are uncovered by the footprint of semiconductor die 523, while two are partially covered by the footprint of semiconductor die 523.

FIG. 5E shows semiconductor die 524 soldered to universal conductive clip 500. Semiconductor die 524 has a different footprint and contact pad configuration. However, contact pad 540 (e.g., a gate contact pad) has the same configuration relative to semiconductor die 520. Semiconductor die 524 has two contact pads in contact pads 534 which are each soldered to four pedestals.

Figures 5F, 5G, 5H, 5I, 5J:
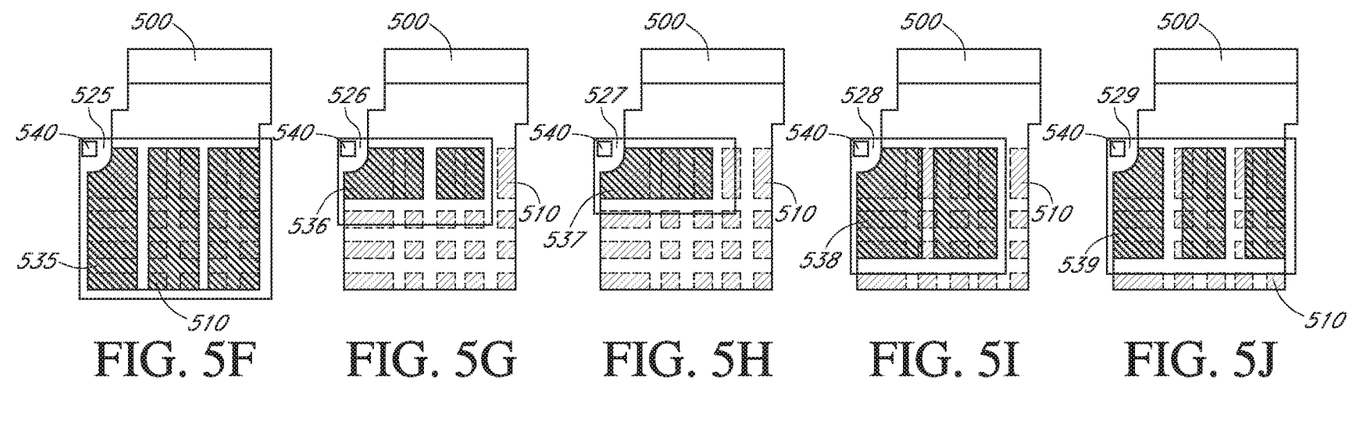
FIG. 5F is a bottom view of one example of semiconductor die 525 soldered to universal conductive clip 500 in accordance with some embodiments of the present application.
FIG. 5G is a bottom view of one example of semiconductor die 526 soldered to universal conductive clip 500 in accordance with some embodiments of the present application.
FIG. 5H is a bottom view of one example of semiconductor die 527 soldered to universal conductive clip 500 in accordance with some embodiments of the present application.
FIG. 5I is a bottom view of one example of semiconductor die 528 soldered to universal conductive clip 500 in accordance with some embodiments of the present application.
FIG. 5J is a bottom view of one example of semiconductor die 529 soldered to universal conductive clip 500 in accordance with some embodiments of the present application.

FIG. 5F shows semiconductor die 525 soldered to universal conductive clip 500. Semiconductor die 525 has a different footprint and contact pad configuration. However, contact pad 540 (e.g., a gate contact pad) has the same configuration relative to semiconductor die 520. Semiconductor die 525 has three contact pads in contact pads 534. All twenty of pedestals 510 are soldered to contact pads 535. In some embodiments, semiconductor die 535 may be the largest semiconductor die that can be accommodated on universal conductive clip 500.

FIG. 5G shows semiconductor die 526 soldered to universal conductive clip 500. Semiconductor die 526 has a different footprint and contact pad configuration. However, contact pad 540 (e.g., a gate contact pad) has the same configuration relative to semiconductor die 520. Semiconductor die 526 has two contact pads in contact pads 536 which are each soldered to two pedestals.

FIG. 5H shows semiconductor die 527 soldered to universal conductive clip 500. Semiconductor die 527 has a different footprint and contact pad configuration. However, contact pad 540 (e.g., a gate contact pad) has the same configuration relative to semiconductor die 520. Semiconductor die 527 has contact pad 537 which is soldered to three pedestals.

FIG. 5I shows semiconductor die 528 soldered to universal conductive clip 500. Semiconductor die 528 has a different footprint and contact pad configuration. However, contact pad 540 (e.g., a gate contact pad) has the same configuration relative to semiconductor die 520. Semiconductor die 528 has two contact pads in contact pads 538: a left-most contact pad soldered to six pedestals and a right-most contact pad soldered to nine pedestals. The left-most and right-most contact pads are both soldered to three common pedestals positioned between the contact pads. The portions of the common pedestals between the contact pads are not soldered. For example, solder paste may be selectively applied to only portions of the top surfaces of the common pedestals that contact the contact pads. The portions having soldering past applied can then be soldered by performing reflow.

FIG. 5J shows semiconductor die 529 soldered to universal conductive clip 500. Semiconductor die 529 has a different footprint and contact pad configuration. However, contact pad 540 (e.g., a gate contact pad) has the same configuration relative to semiconductor die 520. Semiconductor die 529 has three contact pads in contact pads 539. The left-most contact pad is soldered to three pedestals, the middle contact pad is soldered to six pedestals, and the right-most contact pad is soldered to six pedestals.

The configuration of the conductive clip will vary depending on the family of semiconductor dies that are desired to be attached. The size, shape, and spacing of the pedestals can be readily modified to accommodate a family of different semiconductors. In some embodiments, the universal conductive clip can be configured to align certain corners on the contact pads in each semiconductor die in the family. For example, the corners on the contact pads closest to a corner of the semiconductor die may be laterally aligned with corners on the pedestals. In some embodiments, two, three, or four of the closest corners are laterally aligned with the pedestals. Similarly, edges of the contact pads that form a corner closest to a corner of the semiconductor die can be laterally aligned and parallel with an edge of a pedestal. In some embodiments, two, three, or four pairs of linear edges of the contact pads that form a corner closest to a corner of the semiconductor die can be laterally aligned and parallel with an edge of a pedestal. FIGS. 5A-J each demonstrate a configuration where four corners of the contacts pads closest to the corners of the semiconductor die are laterally aligned. FIGS. 5A-J each demonstrate having three pairs of linear edges of the contact pads that form a corner closest to a corner of the semiconductor die that are laterally aligned and parallel with an edge of a pedestal (the corners closest to contact pad 540 are not formed by two linear edges).

Figure 6:
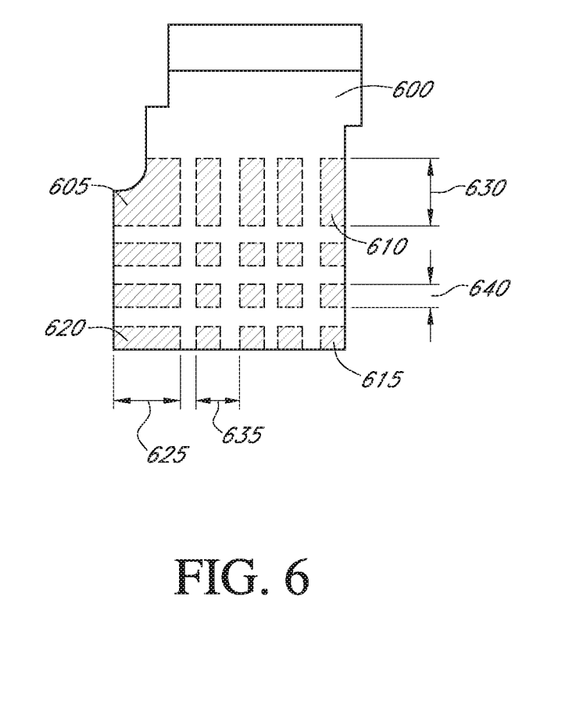
FIG. 6 shows examples of the design considerations when configuring a universal conductive clip for family of semiconductor dies in accordance with some embodiments of the present application.

FIG. 6 shows examples of the design consideration when configuring a universal conductive clip in accordance with some embodiments of the present application. Conductive clip 600 can have first pedestal 605, second pedestal 610, third pedestal 615, and fourth pedestal 620 at the outer corners of the array of pedestals. The positioning at outer corners can be selected to accommodate the largest contact pad footprint in the semiconductor die family. The pedestals at the outer corners may be configured so that the outer edges are laterally aligned and parallel with contact pads (e.g., as depicted in FIG. 5F the outer corner pedestals on conductive clip 500 are soldered to contact pads 535 on semiconductor die 525 so that the outer edges are laterally aligned and parallel).

Width 625 of the left-most column of pedestals (including first pedestal 605 and fourth pedestal 620) can be based on the smallest width of a contact pad in the family. For example, the width of the left-most column of pedestals in universal conductive clip 500 corresponds to the width of the left-most contact pads in semiconductor die 525 and semiconductor die 529. Height 630 of the upper-most row of pedestals can be based on the smallest height of a contact pad in the family. For example, the height of the upper-most row of pedestals in universal conductive clip 500 corresponds to the height of contact pads 536 and contact pads 537 in semiconductor die 526 and semiconductor die 527, respectively. Pitch 635 and height 640 can be determined by analyzing the intermediate-sized semiconductor dies in the family (e.g., semiconductor die 523 and the like for conductive clip 500 as depicted in FIGS. 5A-J)

The universal design for the universal conductive clip described above may similarly be applied to other conductive substrates, such as a lead frame. Thus, some embodiments disclosed herein include a universal lead frame having two or more pedestals that can accommodate different-sized semiconductor dies. The universal lead frame may generally have the same characteristics as the universal conductive clip described above (e.g., universal conductive clip 500 as depicted in FIGS. 5A-J). In some embodiments, a semiconductor die can be soldered to the lead frame such that at least a portion of the pedestals are not soldered to a contact pad. In some embodiments, a semiconductor die can be soldered to the lead frame such that at least a portion of the unsoldered pedestals are not covered by the footprint of the semiconductor die.

Some embodiments disclosed herein include a kit for manufacturing semiconductor devices. The kit can include two or more different semiconductor dies having different contact pad configurations. The kit can include a universal conductive substrate (e.g., a universal lead frame or a universal conductive clip) that is configured to be soldered to the semiconductor dies. The universal conductive substrate can include pedestals configured so that each of the semiconductor dies can have contact pads operably coupled to the pedestals. As an example, the kit can include conductive clip 500 and semiconductor dies 520-529 as depicted in FIGS. 5A-J. In some embodiments, the pedestals on the universal conductive substrate are configured so that two, three, or four of the closest corners on the contact pads (the corners on the contacts pads closest to the corners on the semiconductor die) for each of the semiconductor dies are laterally aligned with the pedestals. In some embodiments, two, three, or four pairs of linear edges of the contact pads that form the closest corners for each of the semiconductor dies can be laterally aligned and parallel with an edge pair of a pedestal.

Some embodiments disclosed herein include a method of making a semiconductor die. The method may be used, for example, to prepare any of the semiconductor devices disclosed in the present application (e.g., semiconductor device 400 as depicted in FIG. 4). The method can include providing a conductive substrate (e.g., lead frame 100 as depicted in FIG. 1A). The conductive substrate can include one or more pedestals on a first side of the conductive substrate, wherein each of the pedestals comprises a planar surface on the first side of the conductive substrate (e.g., pedestals 140 as depicted in FIG. 1A). The method may also include disposing a solder paste between at least one of the planar surfaces on the pedestals on the conductive substrate and one or more contact pads of a semiconductor die such that each of the contacts pads has two or more linear edges that are each laterally aligned and parallel with at least one edge of the planar surfaces on the pedestals (e.g., solder paste 300 and soldering past 340 are applied as depicted in FIGS. 3B-C). The method can also include reflowing the solder paste to solder at least a portion of the pedestals to the contact pads.

From all the foregoing one skilled in the art can determine that according to one embodiment, a semiconductor device comprises: a lead frame comprising a first contact electrically coupled to a first lead, wherein the first contact comprises one or more elevated regions on a first side of the first contact, wherein each of the elevated regions comprises a planar surface on the first side of the first contact; a semiconductor die comprising one or more first contact pads, a second contact pad, and a third contact pad, wherein the first contact pads are disposed on a first side of the semiconductor die, and wherein each of the first contact pads are soldered to at least one of the elevated regions such that each of the first contacts pads has two or more linear edges that are each laterally aligned and parallel with at least one edge of the planar surfaces on the elevated regions; a second lead electrically coupled to the second contact pad of the semiconductor die; and a third lead electrically coupled to the third contact pad of the semiconductor die.

From all the foregoing one skilled in the art can determine that according to one embodiment, a semiconductor device comprises: a lead frame comprising a first contact electrically coupled to a first lead of the semiconductor device; a conductive clip electrically coupled to a second lead on the semiconductor device, wherein the conductive clip comprises one or more elevated regions on a first side of the conductive clip, wherein each of the elevated regions comprises a planar surface on the first side of the conductive clip; and a semiconductor die comprising: a first contact pad on a first side of the semiconductor die, wherein the first contact pad is soldered to the first contact on the lead frame; one or more second contact pads on a second a side of the semiconductor die, wherein each of the second contact pads are soldered to at least one of the elevated regions on the first side of the conductive clip such that each of the second contacts pads has two or more linear edges that are each laterally aligned and parallel with at least one edge of the planar surfaces on the elevated regions; and a third contact pad on the semiconductor die, wherein the third contact pad is electrically coupled to a third lead of the semiconductor device.

From all the foregoing one skilled in the art can determine that according to one embodiment, a method of making a semiconductor device comprises: providing a conductive substrate, the conductive substrate comprising one or more elevated regions on a first side of the conductive substrate, wherein each of the elevated regions comprises a planar surface on the first side of the conductive substrate; disposing a solder paste between at least one of the planar surfaces on the elevated regions on the conductive substrate and one or more contact pads of a semiconductor die such that each of the contacts pads has two or more linear edges that are each laterally aligned and parallel with at least one edge of the planar surfaces on the elevated regions; and reflowing the solder paste to solder at least a portion of the elevated regions to the contact pads.

In view of all of the above, it is evident that a novel device and method is disclosed. Included, among other features, are conductive substrates, such as a lead frame or conductive clip, having elevated regions that can reduce or prevent drifting, tilting, or rotation during reflow. Furthermore, universal conductive substrates configured to be operably soldered to different semiconductor dies are disclosed.

While the subject matter of the invention is described with specific preferred embodiments and example embodiments, the foregoing drawings and descriptions thereof depict only typical embodiments of the subject matter and are not therefore to be considered to be limiting of its scope, it is evident that many alternatives and variations will be apparent to those skilled in the art. For example, the subject matter has been described with respect to particular transistor configurations for the semiconductor die, however various different integrated circuits may also be used. As another example, the subject matter has been described with respect to soldering contact pads to conductive substrates, however other techniques for electrically coupling the contact pads to the conductive substrate may also be used.

As the claims hereinafter reflect, inventive aspects may lie in less than all features of a single foregoing disclosed embodiment. Thus, the hereinafter expressed claims are hereby expressly incorporated into this Detailed Description, with each claim standing on its own as a separate embodiment of an invention. Furthermore, while some embodiments described herein include some but not other features included in other embodiments, combinations of features of different embodiments are meant to be within the scope of the invention, and form different embodiments, as would be understood by those skilled in the art.

What is claimed is:

1. A method for making a semiconductor device, the method comprising:
providing a conductive substrate, the conductive substrate comprising one or more elevated regions on a first side of the conductive substrate, wherein each of the one or more elevated regions comprises each of one or more planar surfaces on the first side of the conductive substrate;
disposing a solder paste between at least one of the one or more planar surfaces on the one or more elevated regions on the conductive substrate and one or more contact pads of a semiconductor die such that each of the one or more contact pads has two or more linear edges that are each laterally aligned and parallel with at least one edge of the one or more planar surfaces on the one or more elevated regions; and
reflowing the solder paste to solder at least a portion of the elevated regions to the contact pads.

2. The method of claim 1, wherein disposing the solder paste between at least one of the one or more planar surfaces on the one or more elevated regions on the conductive substrate and the one or more contact pads of the semiconductor die comprises disposing the solder paste between two or more planar surfaces of the one or more planar surfaces on the one or more elevated regions on the conductive substrate and the one or more contact pads.

3. The method of claim 1, wherein a number of the elevated regions of the one or more elevated regions on the first side of the conductive substrate is greater than a number of the elevated regions of the one or more elevated regions soldered to the one or more contact pads of the semiconductor die.

4. The method of claim 1, wherein a number of the elevated regions of the one or more elevated regions on the first side of the conductive substrate is at least 10.

5. The method of claim 1, wherein a number of the elevated regions of the one or more elevated regions on the first side of the conductive substrate is at least two, and wherein at least a portion of the elevated regions of the one or more elevated regions on the first side of the conductive substrate have different sizes.

6. The method of claim 1, wherein a number of the elevated regions of the one or more elevated regions on the first side of the conductive substrate is at least two, and wherein the elevated regions of the one or more elevated regions are evenly spaced along a first direction.

7. The method of claim 1, wherein providing the conductive substrate comprises providing a lead frame comprising the conductive substrate electrically coupled to a first lead.

8. The method of claim 1, wherein the one or more elevated regions on the first side of the conductive substrate are arranged in a grid having rows and columns, each of the rows having the same number of elevated regions and each of the columns having the same number of elevated regions.

9. The method of claim 1, wherein the semiconductor die is a metal-oxide field-effect transistor (MOSFET).

10. A method for making a semiconductor device, the method comprising:
providing a conductive substrate, the conductive substrate comprising a first elevated region on a first side of the conductive substrate and a second elevated region on the first side of the conductive substrate, wherein the first elevated region comprises a first planar surface on the first side of the conductive substrate, and wherein the second elevated region comprises a second planar surface on the first side of the conductive substrate; and
attaching at least the first planar surface of the first elevated region to a first contact pad of a semiconductor die such that the conductive substrate is electrically coupled to the first contact pad, wherein at least a portion of the second planar surface on the second elevated region is not attached to any contact pad of the semiconductor die.

11. The method of claim 10, wherein the first planar surface of the first elevated region has a first corner that is laterally aligned with a first corner of the first contact pad.

12. The method of claim 10, wherein the first planar surface of the first elevated region has different dimensions than the second planar surface of the second elevated region.

13. The method of claim 10, wherein the conductive substrate comprises at least 10 elevated regions.

14. The method of claim 10, wherein the semiconductor die is a metal-oxide field-effect transistor (MOSFET).

15. The method of claim 10, wherein the second planar surface of the second elevated region is not attached to the semiconductor die.

16. The method of claim 10, wherein only a portion of the second planar surface of the second elevated region is attached to the first contact pad of the semiconductor die, and wherein the second planar surface of the second elevated region is electrically coupled to the first contact pad of the semiconductor die.

17. The method of claim 10, wherein the first planar surface comprises a curved edge, and wherein the second planar surface has a polygonal shape.

18. The method of claim 10, wherein a first portion of the second planar surface of the second elevated region is attached to the first contact pad of the semiconductor die, and a second portion of the second planar surface of the second elevated region is attached to a second contact pad of the semiconductor die.

19. The method of claim 10, wherein the second planar surface of the second elevated region is laterally positioned away from a footprint of the semiconductor die.

20. A method for making semiconductor devices, the method comprising:
providing a first conductive substrate, the first conductive substrate comprising one or more elevated regions on a first side of the first conductive substrate, wherein each of the one or more elevated regions of the first conductive substrate comprises a planar surface on the first side of the first conductive substrate;
providing a second conductive substrate, the second conductive substrate comprising one or more elevated regions on a first side of the second conductive substrate, wherein each of the one or more elevated regions of the second conductive substrate comprises a planar surface on the first side of the second conductive substrate, wherein the first conductive substrate has substantially the same structure as the second conductive substrate;

attaching one or more contact pads of a first semiconductor die to at least one of said one or more elevated regions on the first side of the first conductive substrate; and attaching one or more contact pads of a second semiconductor die to at least one of said one or more elevated regions on the first side of the second conductive substrate, wherein said one or more contact pads of the first semiconductor die have a different configuration than said one or more contact pads of the second semiconductor die.

* * * * *